(12) United States Patent
Disney

(10) Patent No.: US 8,664,067 B2
(45) Date of Patent: Mar. 4, 2014

(54) CMOS DEVICES WITH REDUCED SHORT CHANNEL EFFECTS

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 366 days.

(21) Appl. No.: 12/949,272

(22) Filed: Nov. 18, 2010

(65) Prior Publication Data
US 2012/0126340 A1 May 24, 2012

(51) Int. Cl.
*H01L 29/772* (2006.01)
*H01L 21/336* (2006.01)

(52) U.S. Cl.
USPC ............ 438/291; 438/289; 438/290; 257/402

(58) Field of Classification Search
USPC .................................. 257/404; 438/289–291
See application file for complete search history.

(56) References Cited

U.S. PATENT DOCUMENTS

| | | | | |
|---|---|---|---|---|
| 4,143,388 A | * | 3/1979 | Esaki et al. ................... | 257/327 |
| 4,247,860 A | * | 1/1981 | Tihanyi ......................... | 257/404 |
| 4,784,968 A | * | 11/1988 | Komori et al. ................ | 438/291 |
| 5,413,949 A | * | 5/1995 | Hong ............................. | 438/290 |
| 5,719,081 A | * | 2/1998 | Racanelli et al. ............. | 438/290 |
| 5,792,699 A | * | 8/1998 | Tsui .............................. | 438/290 |
| 6,221,724 B1 | * | 4/2001 | Yu et al. ........................ | 438/289 |
| 6,440,805 B1 | * | 8/2002 | Wang et al. ................... | 438/282 |
| 6,468,852 B1 | * | 10/2002 | Gonzalez et al. ............. | 438/217 |
| 6,876,037 B2 | * | 4/2005 | Wei et al. ...................... | 257/347 |

* cited by examiner

*Primary Examiner* — Matthew W Such
*Assistant Examiner* — Robert Carpenter
(74) *Attorney, Agent, or Firm* — Okamoto & Benedicto LLP

(57) ABSTRACT

An MOS transistor includes a doping profile that selectively increases the dopant concentration of the body region. The doping profile has a shallow portion that increases the dopant concentration of the body region just under the surface of the transistor under the gate, and a deep portion that increases the dopant concentration of the body region under the source and drain regions. The doping profile may be formed by implanting dopants through the gate, source region, and drain region. The dopants may be implanted in a high energy ion implant step through openings of a mask that is also used to perform another implant step. The dopants may also be implanted through openings of a dedicated mask.

7 Claims, 2 Drawing Sheets

CMOS DEVICES WITH REDUCED SHORT CHANNEL EFFECTS

BACKGROUND OF THE INVENTION

1. Field of the Invention

The present invention relates generally to electrical devices, and more particularly but not exclusively to CMOS devices.

2. Description of the Background Art

Devices fabricated using complementary metal-oxide-semiconductor (CMOS) technology are used in many electrical circuits, including those in integrated circuit (IC) form. A CMOS transistor is an example of a CMOS device. As is well known, a CMOS transistor includes a source, a drain, and a gate. An enhancement-mode CMOS transistor may be switched ON by applying a positive voltage greater than the threshold voltage on the gate to create an inversion layer, also referred to as a "channel," along the interface of the gate and the transistor's body region. The channel provides a path for electron current to flow from the source, through the channel, and into the drain. Reducing the gate voltage removes the channel, thereby switching OFF the transistor.

Transistors are being designed with shorter channel lengths to pack more transistors in a given integrated circuit. This leads to undesirable short channel effects, such as punch-through leakage. Conventional solutions for reducing short channel effects include thinner gate oxides and heavier body doping. These solutions are not without drawbacks. Thinner gate oxides limit the maximum gate voltage of the transistor, while heavier body doping reduces the breakdown voltage and worsens hot-carrier reliability.

SUMMARY

In one embodiment, an MOS transistor includes a doping profile that selectively increases the dopant concentration of the body region. The doping profile has a shallow portion that increases the dopant concentration of the body region just under the surface of the transistor under the gate, and a deep portion that increases the dopant concentration of the body region under the source and drain regions. The doping profile may be formed by implanting dopants through the gate, source region, and drain region. The dopants may be implanted in a high energy ion implant step through openings of a mask that is also used to perform another implant step. The dopants may also be implanted through openings of a dedicated mask.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not to scale.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. This disclosure describes a P-channel MOS (PMOS) transistor, but the invention also includes N-channel MOS (NMOS) transistors.

Figure 1:
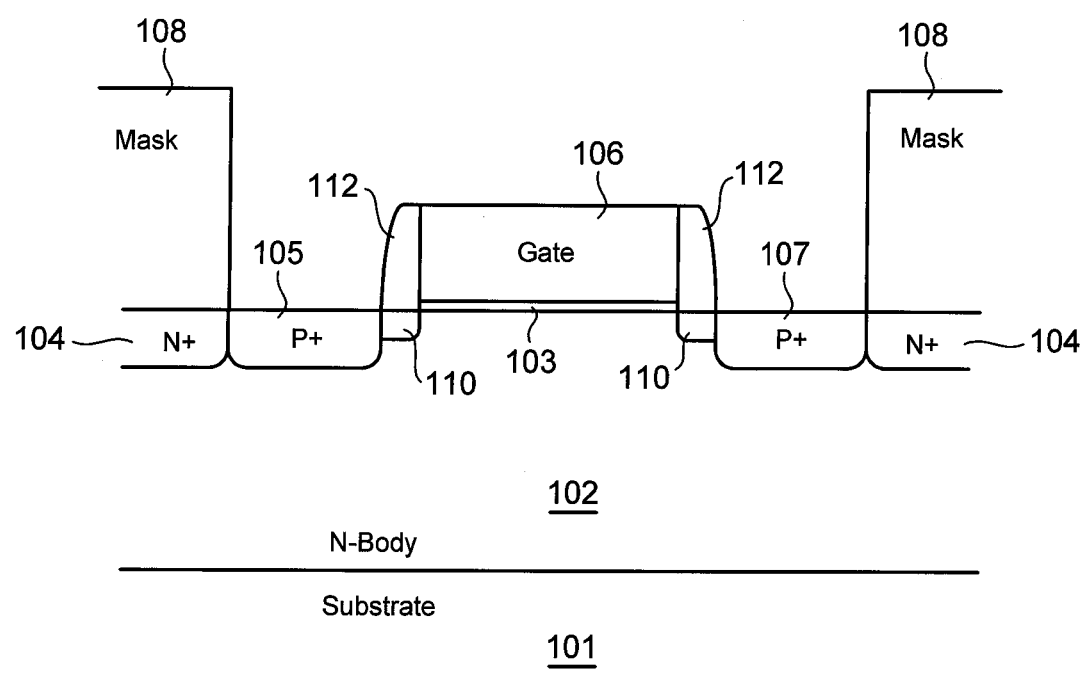
FIG. 1 shows a cross-section of a PMOS transistor being fabricated in accordance with an embodiment of the present invention.

FIG. 1 shows a cross-section of a PMOS transistor being fabricated in accordance with an embodiment of the present invention. The transistor is fabricated in an N-body region 102 of a silicon substrate 101. In the example of FIG. 1, the transistor is an enhancement-mode P-channel metal-oxide-semiconductor field effect transistor (PMOSFET). The transistor includes a P+ source region 105, a gate 106, and a P+ drain region 107. The transistor further includes a gate dielectric in the form of a gate oxide 103, lightly doped drain (LDD) regions 110, and sidewall spacers 112. The gate oxide 103 may comprise thermal and/or deposited silicon dioxide, for example. N+ body contact region 104 provides contact regions for electrodes to electrically couple to the body region 102.

As can be appreciated, the conductivity and doping of materials/regions disclosed herein may be varied, with appropriate changes to the conductivity and doping of other materials/regions, depending on the application.

The P+ source region 105 and the P+ drain region 107 are formed by ion implantation. In the example of FIG. 1, a mask 108 together with the sidewall spacers 112 defines the area in the N-body region 102 where the source region 105 and the drain 107 are formed. The mask 108 may comprise masking material typically used in lithography, such as photoresist. As is conventional, the P+ source region 105 and the P+ drain region 107 extend from the top surface of the transistor.

Figure 2:
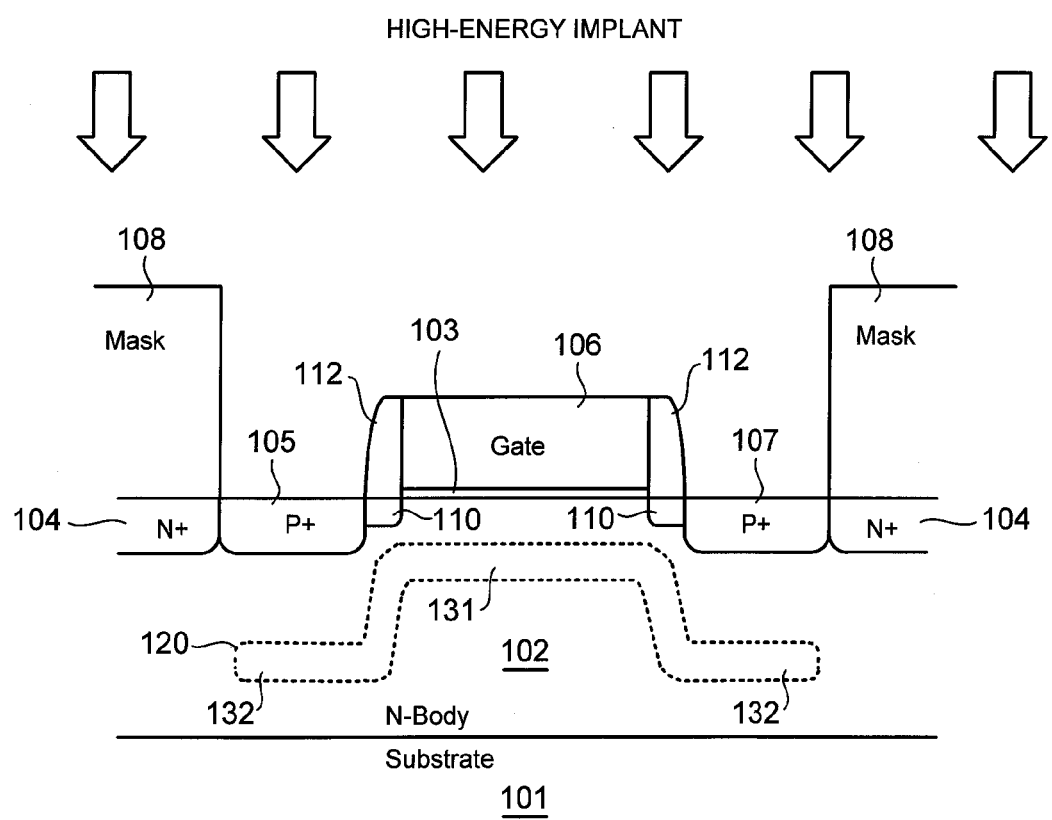
FIG. 2 shows the structure of FIG. 1 undergoing a high-energy ion implant step to form a stepped doped region in accordance with an embodiment of the present invention.

In the example of FIG. 2, a high-energy ion implant step is performed on the structure of FIG. 1 to form a stepped doped region 120 in the N-body region 102. In one embodiment, the high-energy ion implant is performed through openings of a pre-existing mask that is also used in another ion implant step. This is the case in the example of FIG. 2 where the same mask 108 previously used in the implant of dopants to form the P+ source region 105 and the P+ drain region 107 is again used in the high-energy ion implant to form the stepped doped region 120. The high-energy ion implant may be performed in-situ (i.e., in one loading of the substrate into the ion implant tool) with the ion implant to form the source region 105 and the drain region 107. As another example, the high-energy ion implant may be performed using the same mask used for the implant of dopants to form the LLD regions 110. Using a mask also used in other ion implant steps saves fabrication cost by eliminating a masking step.

In another embodiment, the high-energy ion implant for forming the stepped doped region 120 is performed through openings of a dedicated mask layer, which is not used in any other ion implant step, to introduce the implanted dopants only in certain areas (e.g., under certain devices).

In the example of FIG. 2, the stepped doped region 120 is formed by high-energy implant of N-type dopants (e.g., phosphorus) into the N-body region 102. As can be appreciated, the dopants for the high-energy implant are P-type dopants (e.g., boron) in the case where the body region 102 is a P-well (e.g. for an NMOS transistor).

Still referring to FIG. 2, the N-type dopants are implanted through the gate 106 and the gate oxide 103 into the pre-existing N-body region 102. In one embodiment, these dopants are also implanted through sidewall spacers 112, which may comprise for example an oxide, polysilicon, or silicon nitride material. The mask 108 should be thick enough to substantially block the implant (i.e. any implant that penetrates the mask layer should not have a significant adverse effect on any underlying devices). In the example of FIG. 2, the gate 106 comprises polysilicon (e.g., about 4000 Angstroms to 8000 Angstroms thick) and the N-body region 102 is in a silicon substrate 101.

Implanted ions can penetrate only through a certain thickness of material. This penetration depth is known as the implant range, and is a function primarily of the implant ion species, the implantation energy, and the angle of coincidence between the implantation and the substrate. When an implantation is performed through a stack of materials with various total thicknesses, the range of the implanted region naturally follows the contour of the stack of materials. Thus, the implanted region 120 has a stepped doping profile, with dopants implanted through the gate 106 being shallower in the N-body region 102, closer to the gate oxide 103, while dopants implanted outside of the gate 106 (e.g. through the P+ source region 105 and the P+ drain region 107) are formed deeper in the N-body region 102.

The resulting stepped doped region 120 has a shallow portion (generally labeled as "131") under the gate 106 and deep portions (generally labeled as "132") outside of the gate 106. The stepped doped region 120 selectively increases the dopant concentration of the N-body region 102. That is, the stepped doped region 120 increases the dopant concentration of the N-body region 102 only in selected portions but not in other portions. For example, the edges of the shallow portion are naturally aligned to the edges of the gate and/or sidewall spacers, and this shallow portion does not substantially extend to regions under the P+ source region 105 and the P+ drain region 107 As shown in FIG. 2, the shallow portion is closer to the surface of the transistor relative to the deep portion. A high-energy ion implant step is employed to allow the implant to penetrate through the gate 106. As an example, the dopants forming the shallow portion of the stepped doped region 120 may be implanted through a gate 106 that is around 6000 Angstroms thick using phosphorous implanted at an energy greater than 200 keV, e.g., about 400-800 keV. The resulting shallow portion of the stepped doped region 120 (under the gate 106) has a retrograde profile (i.e. lower doping concentration at the surface than at some depth below the surface). That is, the stepped doped region 120 has higher dopant concentration compared to dopant concentration at the surface of the body region 102. For example, the peak or maximum concentration may be disposed about 0.5 μm-1.5 μm below the gate oxide 103.

The threshold voltage of the transistor is affected by the thickness of the gate oxide 103 and the dopant concentration near the surface of the N-body region 102. The shallow portion of the stepped doped region 102 is formed deep enough so that the dopant concentration near the surface is not high enough to significantly increase the threshold voltage of the transistor. The dosage and energy for the high-energy implant to achieve this depends on the particulars of the device, and may be determined by simulation and optimized by experiments. Generally speaking, the extra dopant concentration near the surface of the N-body region 102 introduced by the high-energy implant is preferably lower than the background dopant concentration of the N-body region 102. In one embodiment, the extra dopant concentration introduced by the high-energy implant is less than 10% of the surface dopant concentration of the N-body region 102.

The retrograde profile of the stepped doped region 120 has the advantage of providing extra doping below the surface between the source and drain regions, where the increased doping is most helpful to reduce short channel effects, such as punch-through leakage, without substantially affecting the threshold voltage. An advantage of the self-aligned stepped profile is that the deep portions of the stepped doped region 120 (not under the gate 106) are separated vertically from the source and drain regions, minimizing the impact on hot carrier injection and breakdown voltage. The stepped doped region 120 thus allows the transistor to have a short channel while preventing introduction of the aforementioned short channel effects.

The high-energy ion implant for forming the stepped doped region 120 is preferably formed late in the fabrication process of the transistor to minimize thermal drive-in and maintain its as-implanted profile. In the example of FIG. 2, the high-energy ion implant is performed after formation of at least the N-body region 102, gate oxide 103, and poly gate formation. In a double-diffused bipolar-CMOS-DMOS process, the high-energy implant is preferably performed after the P-body drive-in and related thermal drive-ins steps.

CMOS devices with reduced short channel effects and methods for fabricating same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating an MOS transistor, the method comprising:
providing a substrate with a body region that is doped with first dopants of a first conductivity type; and
implanting second dopants of the first conductivity type into the body region, the second dopants being implanted through a source region, a gate, and a drain region of the transistor to form a doping profile that selectively increases dopant concentration in the body region, the doping profile having a shallow portion that increases dopant concentration of the body region under the gate and having a deep portion that increases the dopant concentration of the body region under the source region and the drain region, the shallow portion being closer to a surface of the body region relative to the deep portion, wherein the doping profile and the source and drain regions are formed in-situ using a same lithography mask that locates the doping profile in the body region and locates the source and drain regions.

2. The method of claim 1 wherein the MOS transistor is a P-channel transistor and the first and second dopants comprise N-type dopants.

3. The method of claim 1 wherein the second dopants are implanted by high-energy ion implantation comprising an implant energy greater than 200 keV.

4. The method of claim 1 wherein the gate comprises polysilicon with a thickness in the range of 4000 A to 8000 A and the substrate comprises single-crystalline silicon.

5. The method of claim 1 wherein the doping profile has a retrograde profile.

6. The method of claim 1 wherein the doping profile has a maximum dopant concentration at a first depth below the surface of the body region under the gate, the first depth being in the range of 0.5 μm to 1.5 μm.

7. The method of claim 6 wherein the doping profile has a surface dopant concentration adjacent the surface of the body region, the surface dopant concentration being less than a dopant concentration of the body region.

* * * * *